United States Patent
Jang et al.

[11] Patent Number: 6,013,561
[45] Date of Patent: Jan. 11, 2000

[54] METHOD FOR FORMING FIELD OXIDE FILM OF SEMICONDUCTOR DEVICE

[75] Inventors: Se Aug Jang; Byung Jin Cho; Jong Choul Kim, all of Ichon, Rep. of Korea

[73] Assignee: Hyundai Electronics Industries Co., Ltd., Kyoungki-do, Rep. of Korea

[21] Appl. No.: 08/961,132

[22] Filed: Oct. 30, 1997

[30] Foreign Application Priority Data

Dec. 20, 1996 [KR] Rep. of Korea ....................... 96-68904

[51] Int. Cl.⁷ .................................................. H01L 21/76
[52] U.S. Cl. ........................ 438/452; 438/444; 438/439; 438/445
[58] Field of Search .................... 438/444, 445, 438/452, 439, 297

[56] References Cited

U.S. PATENT DOCUMENTS

| | | |
|---|---|---|
| 4,278,705 | 7/1981 | Agraz-Guerena et al. ............. 438/452 |
| 4,965,221 | 10/1990 | Dennison et al. . |
| 4,981,813 | 1/1991 | Bryant et al. . |
| 5,057,463 | 10/1991 | Bryant et al. . |
| 5,139,964 | 8/1992 | Onishi et al. . |
| 5,151,381 | 9/1992 | Liu et al. ................................ 438/452 |
| 5,637,528 | 6/1997 | Higashitani et al. .................... 438/774 |
| 5,637,529 | 6/1997 | Jang et al. . |
| 5,714,414 | 2/1998 | Lee et al. ................................ 438/452 |

FOREIGN PATENT DOCUMENTS

| | | |
|---|---|---|
| 0 146 895 A2 | 7/1985 | European Pat. Off. . |
| 0 167 208 A2 | 1/1986 | European Pat. Off. . |
| 0 284 456 | 9/1988 | European Pat. Off. . |

*Primary Examiner*—Trung Dang
*Attorney, Agent, or Firm*—Thelen Reid & Priest, LLP

[57] ABSTRACT

A method for forming a field oxide film of a highly integrated semiconductor device, in which an annealing step is carried out during a field oxide film formation step for growing the field oxide film adapted to isolate elements of the semiconductor device. By the annealing step, it is possible to prevent a stress concentration phenomenon from occurring in a semiconductor substrate on which the field oxide film is formed, thereby reducing or eliminating a field oxide thinning phenomenon.

15 Claims, 7 Drawing Sheets

METHOD FOR FORMING FIELD OXIDE FILM OF SEMICONDUCTOR DEVICE

BACKGROUND OF THE INVENTION

1. Field of the Invention

The present invention relates to a method for fabricating a semiconductor device, and more particularly to a method for forming a field oxide film of a highly integrated semiconductor device.

2. Description of the Prior Art

Generally, semiconductor devices have a field oxide film which is formed using an oxidation of silicon. Such a field oxide film is adapted to isolate adjacent active elements.

In the formation of a field oxide film, various conditions are required. For example, the field oxide film should have a short bird's beak in order to provide a wide active region. The field oxide film should also have a sufficient thickness even in a narrow oxidation window.

Where such a field oxide film has a certain large thickness, an increase in the threshold voltage of an associated parasitic transistor can be exhibited. In this case, an increase in punchthrough voltage is also exhibited.

Where a field oxide film is formed using the silicon oxidation, it is sufficiently grown in a wide field region to have a sufficient thickness while it is insufficiently grown in a narrow field region.

For instance, where a silicon oxidation is carried out in such a manner that a field oxide film is grown to a thickness of 3,000 Å, there is a phenomenon that the field oxide film is grown only to a thickness of 2,000 Å.

Such a phenomenon is called a "field oxide thinning effect". Where a design rule of 0.5 $\mu$m or less is used, it is impossible to form a field oxide film having a sufficient thickness.

Where a field oxide film is grown in such a manner that it has a very large thickness in a wide field region, it can have a more or less sufficient thickness in a narrow field region. In this case, however, there is a problem in that an elongated bird's beak is formed.

In the formation of a field oxide film, consequently, it is required to sufficiently grow the field oxide film in a narrow field region while preventing the field oxide film from having a large thickness in a wide field region.

Although several theories are known in association with the cause of the field oxide thinning effect, the commonly recognized theory is a stress theory. J. W. Lutze, et al. demonstrated that a field oxide thinning phenomenon occurring in a poly buffer local oxidation silicon (LOCOS) (PBL) structure is caused by internal compressive stress existing in the filed oxide film ("Filed oxide thinning in poly buffer LOCOS isolation with active area spacings to 0.10 $\mu$m", Journal of Electrochemical Society, Vol. 137, No. 6, p1867–1870 (1990)).

That is, as the oxidation proceeds, the field oxide film expands in volume while compressive stress existing in the field oxide film in a narrow field region increases relatively. As a result, the oxidation rate decreases.

Meanwhile, current semiconductor devices use a design rule of sub-quarter microns or less not allowing the formation of the least bird's beak.

For such semiconductor devices, it is impossible to use a structure, in which its pad oxide film is exposed, fabricated in accordance with the LOCOS or PBL technique. This is because such a structure can not prevent the formation of bird's beak.

In this regard, a technique, which fabricates the structure of FIG. 1, has been highlighted. The structure of FIG. 1 has a semiconductor substrate 1 formed with a recess having a certain depth in order to increase the volume ratio of a field oxide film formed over the semiconductor substrate 1, namely, the ratio of the thickness of a portion of the field oxide film disposed in the recess to the thickness of the other field oxide film portion. This structure also has a pad oxide film 2 formed over the silicon substrate 1 and spacers comprised of an oxidation-resistant film such as a nitride film and adapted to shield exposed portions of the pad oxide film 2.

Even in this structure, however, the field oxide thinning phenomenon, which occurs in LOCOS or PBL structures, is inevitably generated because the field oxide film is grown in accordance with an oxidation. Furthermore, this structure, which uses nitride film spacers as mentioned above, also involves the generation of stress having an influence on the field oxide thinning phenomenon, in addition to the generation of internal stress in the field oxide film demonstrated by Lutze, et al. This is because, the silicon substrate portions 5 disposed beneath the nitride film spacers 4 are subjected to compressive stress.

The nitride of the nitride film spacers 4 is a material having an intrinsic tensile stress. For this reason, the silicon substrate portions 5 is applied with compressive stress from the nitride film. It is difficult for oxygen to penetrate the silicon of the silicon substrate portions 5 where compressive stress is accumulated. As a result, an increased field oxide thinning effect is exhibited.

FIG. 2 is a diagram depicting a stress distribution in the structure of FIG. 1, which is measured by a Tsuprem-4 simulation after the formation of the nitride film spacers 4.

Referring to FIG. 2, it is understood that a concentration in compressive stress occurs at the silicon substrate portions respectively disposed beneath the nitride film spacers 4.

Accordingly, it is possible to reduce or eliminate the field oxide thinning effect by relieving the concentrated compressive stress because the field oxide thinning effect is caused by the compressive stress.

Two parameters associated with the relief of such compressive stress are known.

One parameter is "temperature". For instance, an easy relief of compressive stress is achieved at a high temperature because the viscosity of solids decreases at the high temperature so that the flowability of the solids increases.

Accordingly, a high temperature field oxidation has been used in the conventional PBL method in order to relieve internal stress existing in field oxide films.

In the case of the structure shown in FIG. 1, it is also possible to relieve the stress of the silicon portions 5 disposed beneath the nitride film spacers 4 as well as the internal stress of the field oxide film by carrying out the field oxidation at a high temperature. Accordingly, a reduction or elimination of the field oxide thinning effect is achieved.

FIG. 3 is a graph depicting the influence of oxidation temperature on the field oxide thinning effect in accordance with the conventional technique.

In FIG. 3, the y axis represents a variation in the thickness of a field oxide film grown in a narrow oxidation window while varying the field oxidation temperature under the condition in which the field oxide film has a constant thickness of 3,000 Å in a wide field region.

The thickness variation is measured in percentage. For example, "50%" means that the field oxide film has a thickness of 1,500 Å in the narrow oxidation window. Referring to the graph, it is understood that the field oxide film has an increased thickness in the narrow field region at an increased field oxidation temperature.

The other parameter associated with the relief of stress is a "relief time".

At the same oxidation temperature, an increase in the relief time results in an increase in the amount of relieved stress.

SUMMARY OF THE INVENTION

Therefore, an object of the invention is to solve the above-mentioned problems involved in the prior art and to provide a method for forming a field oxide film of a highly integrated semiconductor device, which is capable of reducing or eliminating a field oxide thinning phenomenon.

Another object of the invention is to provide a method for forming a field oxide film of a highly integrated semiconductor device, which is capable of reducing or eliminating a field oxide thinning phenomenon, thereby achieving an improvement in the electrical characteristics of the highly integrated semiconductor device.

In accordance with one aspect, the present invention provides a method for forming a field oxide film of a semiconductor device, wherein an annealing step is carried out during a field oxide film formation step for growing the field oxide film.

In accordance with another aspect, the present invention provides a method for forming a field oxide film of a semiconductor device, comprising the steps of: providing a semiconductor substrate; sequentially forming a pad oxide film and a first nitride film over the semiconductor substrate; over-etching the first nitride film and the pad oxide film; forming a second nitride film over the entire exposed surface of the resulting structure; selectively removing the second nitride film in such a manner that the second nitride film is left only on respective side surfaces of the first nitride film and pad oxide film, thereby forming spacers; selectively removing an exposed surface of the semiconductor substrate while using the spacers and the first nitride film as a mask, thereby forming a recess in the semiconductor substrate; and forming a field oxide film in the recess of the semiconductor substrate while annealing the semiconductor substrate in the process of the formation of the field oxide film.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

Figure 1:
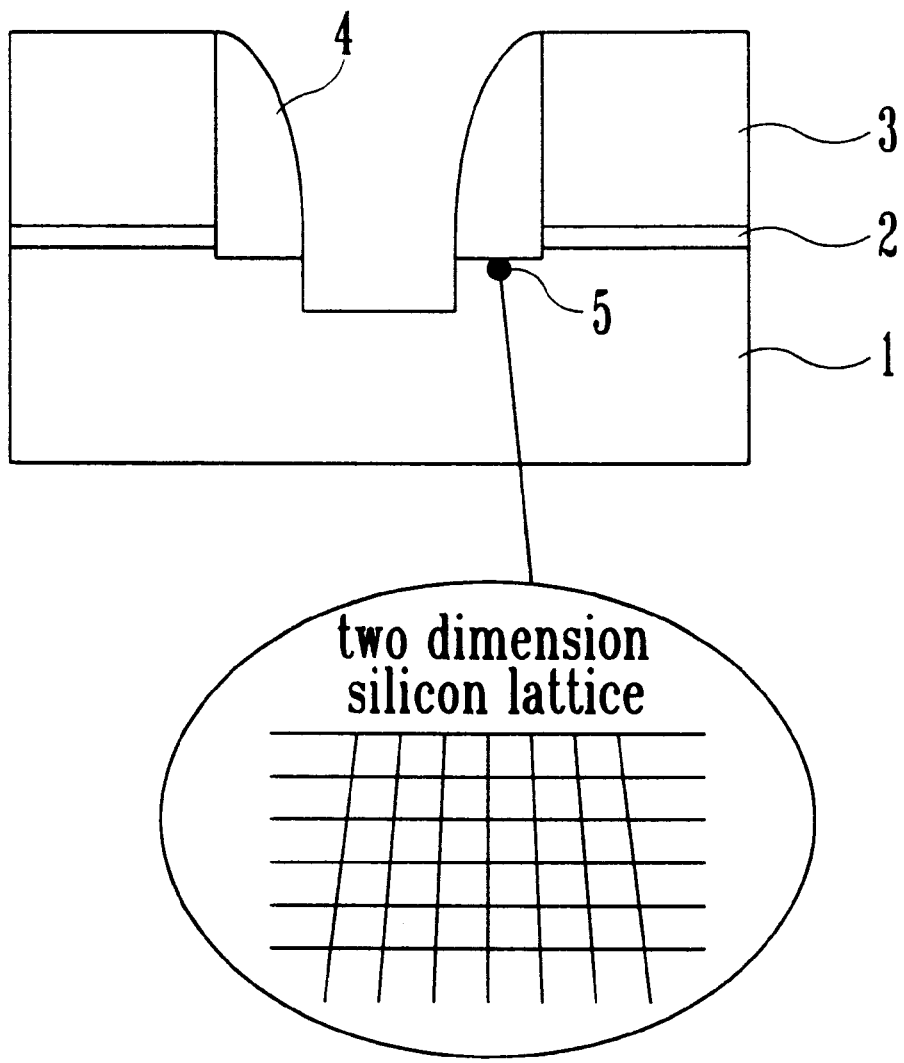
FIG. 1 is a sectional view illustrating a stressed state of a silicon substrate portion disposed beneath a nitride spacer in a conventional structure.
Figure 2:
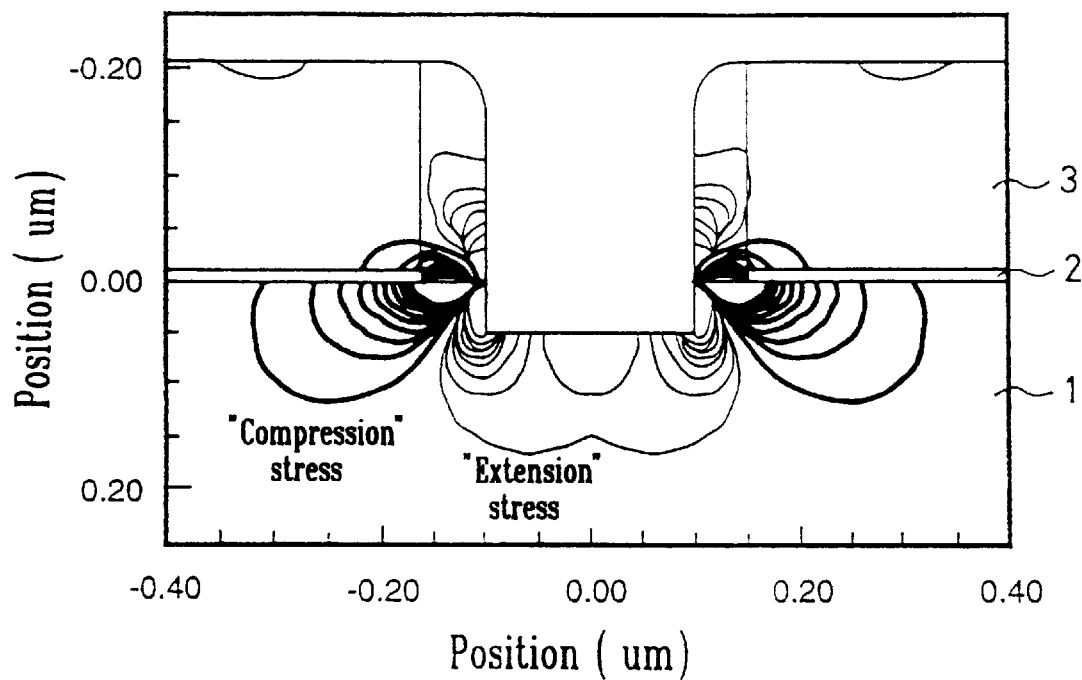
FIG. 2 is a diagram depicting a stress distribution in the structure of FIG. 1, which is measured by a Tsuprem-4 simulation after the formation of the nitride film spacers.
Figure 3:
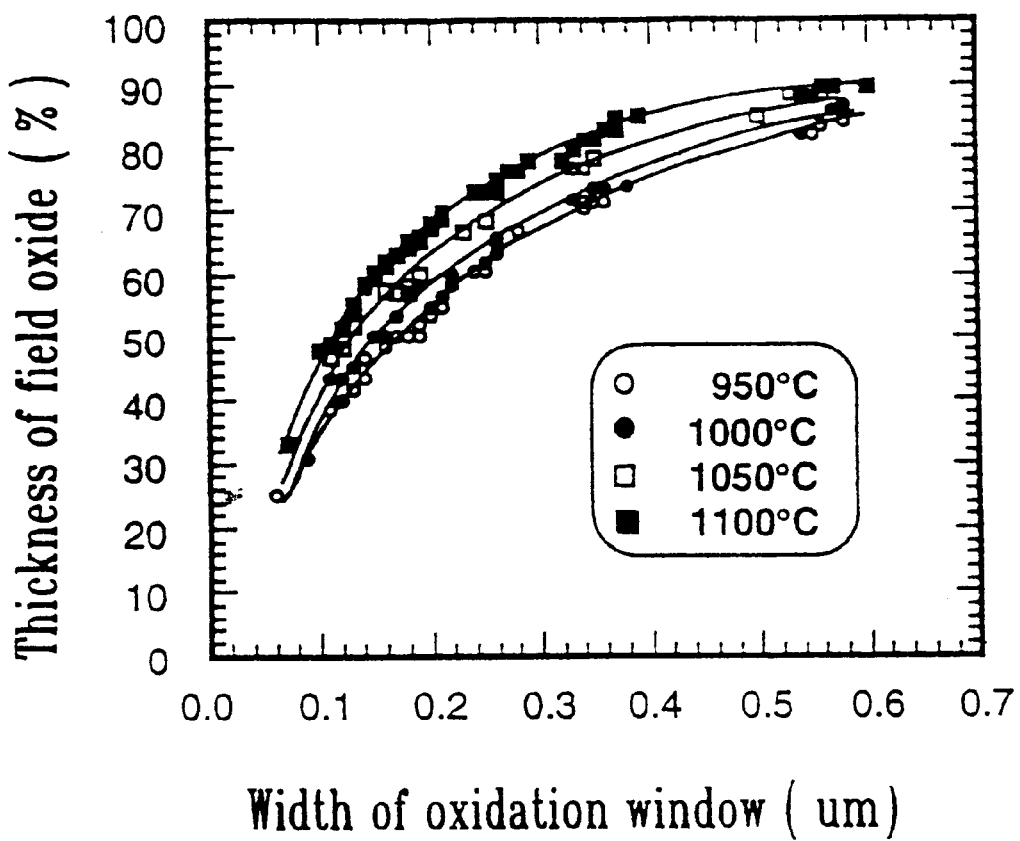
FIG. 3 is a graph depicting the influence of oxidation temperature on a field oxide thinning effect in accordance with the prior art.
Figure 4:
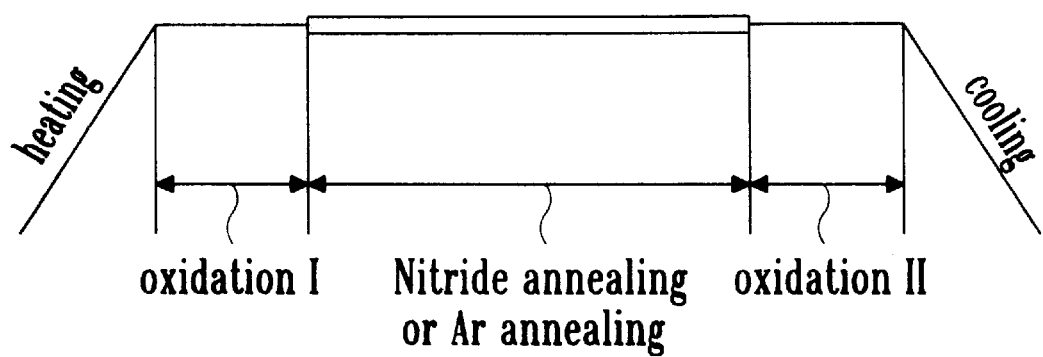
FIG. 4 is a view illustrating a field oxide film formation method according to the present invention which involves a sufficient stress relief time.

FIG. 4 illustrates a field oxide film formation method according to the present invention which involves a sufficient stress relief time.

A field oxide growth recipe according to the present invention will be first described in conjunction with FIG. 4. In accordance with the field oxide growth recipe of the present invention, a substrate is first heated to a target temperature. At the target temperature, an oxide film is grown over the substrate to a thickness corresponding to a portion of the thickness of an oxide film to be finally obtained (Oxidation I).

In the process of the oxidation, the substrate is annealed in an atmosphere containing inert gas such as nitrogen or argon, in order to give a stress relief time. Thereafter, a secondary field oxidation is carried out to form an oxide film to a thickness corresponding to the remaining portion of the thickness of the oxide film to be finally obtained (Oxidation II).

FIGS. 5 to 9 are sectional views respectively illustrating sequential steps of the field oxide film formation method according to the present invention.

Figure 5:
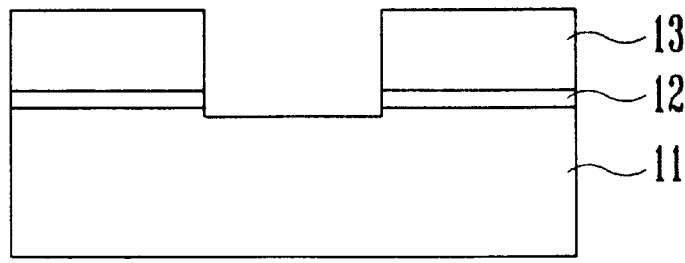
FIGS. 5 to 9 are sectional views respectively illustrating sequential steps of the field oxide film formation method according to the present invention.

In accordance with this method, a semiconductor substrate 11 is first oxidized, thereby forming a pad oxide film 12 thereover, as shown in FIG. 5. A first nitride film 3 is then deposited over the pad oxide film 12. The first nitride film 13 is then etched at its portion corresponding to a field region in accordance with a photoetch process. At this time, an overetching is carried out in such a manner that the semiconductor substrate 11 is recessed to a depth of about 50 to 100 Å.

Figure 6:
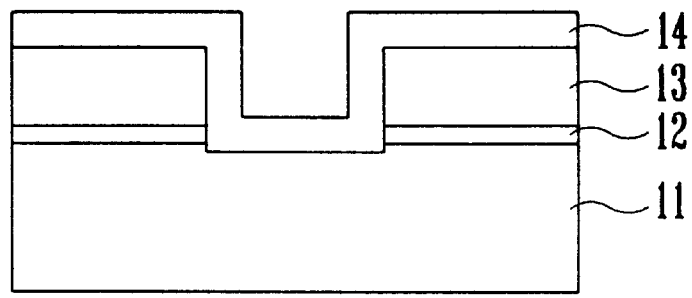

Thereafter, a second nitride film is deposited over the entire surface of the resulting wafer, as shown in FIG. 6.

Figure 7:
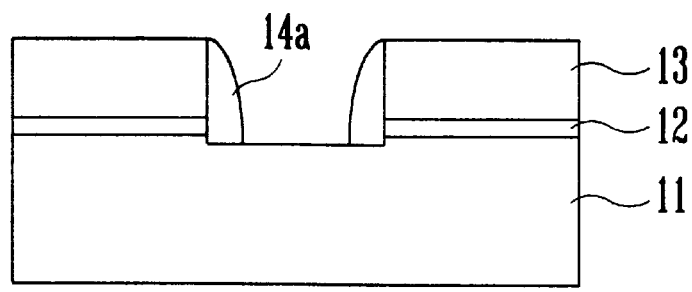

The second nitride film is then dry-etched at the whole surface thereof without using any mask, thereby forming nitride film spacers 14a, as shown in FIG. 7.

Figure 8:
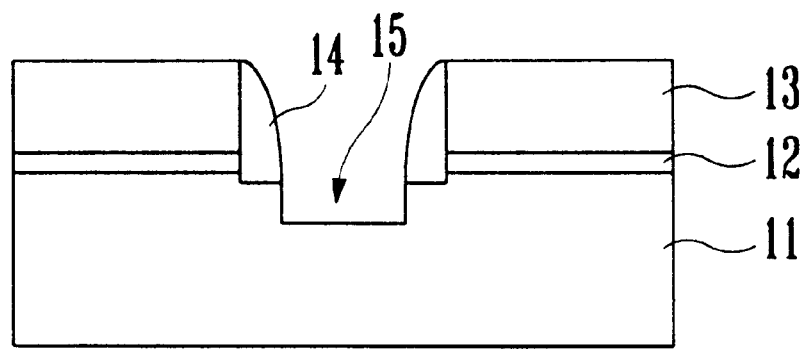

Using the nitride film spacers 14a and first nitride film 13 as a mask, the semiconductor substrate 11 is then etched in accordance with a dry silicon etch process (namely, a recess etch process) at its exposed portion, thereby forming a recess 15 therein, as shown in FIG. 8.

Figure 9:
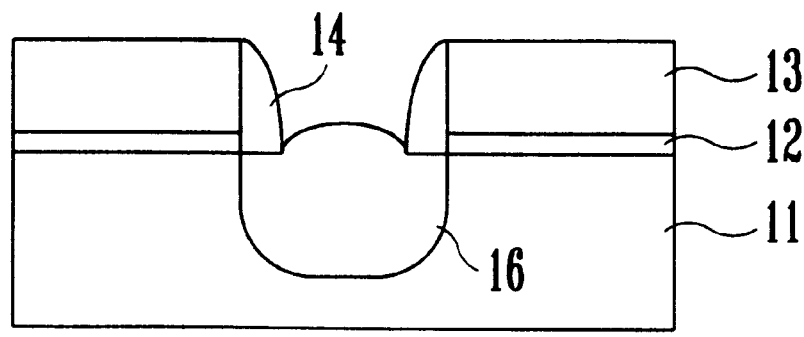

Subsequently, a field oxide film 16 is formed in the semiconductor substrate 11, using a field oxidation method involving an annealing step carried out during a field oxidation, as shown in FIG. 9.

The field oxidation of FIG. 9 will now be described in more detail.

First, the semiconductor substrate 11 is heated to a target temperature for the field oxidation, for example, 950° C. A field oxide film is then primarily grown over the exposed portion of the semiconductor substrate 11 to a thickness corresponding to half (½) the target thickness of a field oxide film to be finally obtained (Oxidation I). For example, the field oxide film is grown to a thickness of 1,500 Å.

Thereafter, the resulting structure is heated to a higher temperature of about 1,000 to 1,200° C. The heated resulting structure is then annealed in an atmosphere containing inert gas such as nitrogen or argon for about 30 minutes to 5 hours.

After completing the annealing step, a field oxide film 16 is secondarily grown over the primarily-grown field oxide film to a thickness corresponding to the remaining portion of the target thickness, namely, a thickness corresponding to half the target thickness, at a lower temperature of 950° C. Thus, the field oxidation is completed.

Alternatively, the field oxide film 16 may be formed to have a target thickness of 3,000 Å at a temperature of 1,100° C. In this case, a field oxide film is first grown to a thickness of 1,500 Å at a temperature of 1,100 Å (Oxidation I).

Thereafter, the resulting structure is annealed at 1,100° C. in an atmosphere containing inert gas such as nitrogen or argon for about 30 minutes to 5 hours under the condition in which the structure is shielded from oxygen. Where this annealing is to be carried out at a temperature of 1,200° C., the structure is heated to 1,200° C. before the annealing.

A field oxide film is then grown to a thickness of 1,500 Å corresponding to the remaining portion of the target thickness (Oxidation II).

The thickness ratio between the oxide films respectively grown at the oxidation steps I and II is preferably 1:1. In some cases, however, the thickness ratio can be optionally adjusted.

The primary oxidation step I, annealing step and secondary oxidation step II may be carried out in accordance with independent recipes, respectively.

Although two successive oxidation steps are carried out in the illustrated case, such oxidation steps may be repeatedly carried out while involving an annealing step between two successive oxidation steps. In other words, the annealing step may be repeatedly carried out among successive oxidation steps.

As an annealing step is repeatedly carried out several times among successive oxidation steps, it is possible to further reduce or completely eliminate the field thinning phenomenon.

Thus, the present invention is not limited to the element isolation method illustrated in FIGS. 5 to 9.

In other words, the field oxidation method of the present invention may also be applied to all element isolating film formation methods, such as LOCOS and PBL methods, in which a field oxide film is formed by thermally oxidizing a silicon substrate.

Figure 10:
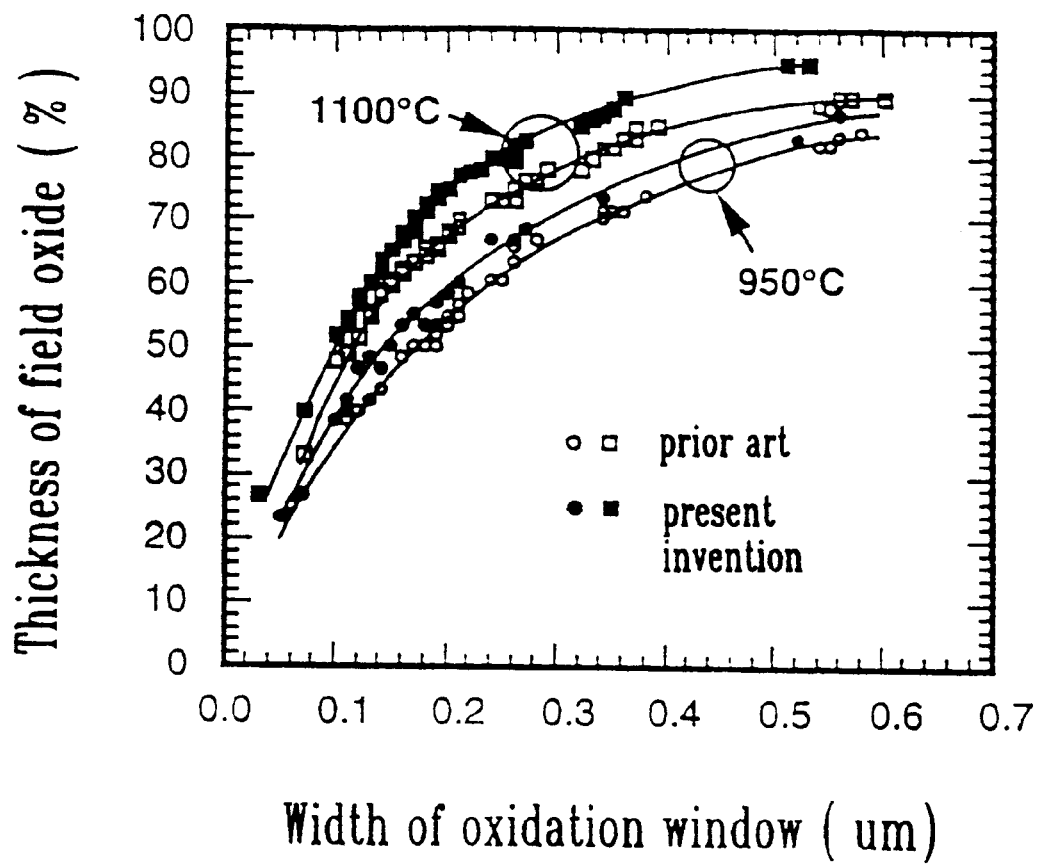
FIG. 10 is a graph depicting the influence of oxidation temperature on the field thinning effect involved in an element oxidation method in order to evaluate an improvement in the field thinning effect obtained by the field oxidation method according to the present invention.

FIG. 10 is a graph depicting the influence of temperature on the field thinning effect involved in the element oxidation method in order to evaluate an improvement in the field thinning effect obtained by the field oxidation method according to the present invention.

The graph depicts measured results of field oxide films respectively formed in accordance with the present invention and the conventional method where each of the field oxide films is formed to a target thickness of 3,000 Å over a considerably wide field region. Referring to data associated with a temperature of 950° C., it can be found that a field oxide film is grown to a thickness of 3,000 Å in a continued manner at a temperature of 950° C. in accordance with the conventional method.

However, in accordance with the present invention, an oxide film is primarily formed to a thickness of 1,500 Å at 950° C. After the primary oxidation, an annealing step is carried out at a temperature of 1,100° C. in a nitrogen atmosphere for 30 minutes. After the annealing step, a secondary field oxide film of 1,500 Å is grown in a state cooled to 950° C.

On the other hand, it can also be understood by referring to data associated with a temperature of 1,100° C. that a field oxide film is grown to a thickness of 3,000 Å in a continued manner at a temperature of 1,100° C. in accordance with the conventional method.

However, in accordance with the present invention, an oxide film is primarily formed to a thickness of 1,500 Å at 1,100° C. After the primary oxidation, an annealing step is carried out in a nitrogen atmosphere for 30 minutes while shielding oxygen. After the annealing step, a secondary field oxide film of 1,500 Å is grown in an oxidation atmosphere.

As apparent from the above description, the element isolating film formation method according to the present invention provides various effects.

That is, the method of the present invention provides an improvement in the field thinning effect by about 5 to 10% as compared to the conventional method involving no annealing step. This is apparent from the data of FIG. 10 obtained in two cases respectively associated with the temperatures of 950° C. and 1,100° C.

Even at an oxidation window width of 0.20 μm or less, the present invention provides an improvement in the field thinning effect by about 5 to 10%. Accordingly, it is possible to achieve an improvement in the electrical characteristics of highly integrated semiconductor devices.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for forming a field oxide film of a semiconductor device, the field oxide film formation method comprising:
    a) a primary oxidation step;
    b) an annealing step that is carried out after the primary oxidation step for 0.5 hour to 5 hours in an inert gas atmosphere, to relieve a stress that occurs in the primary oxidation step; and
    c) a secondary oxidation step that is carried out after the annealing step.

2. The method in accordance with claim 1, wherein a ratio between:
    (A) the thickness of a field oxide film grown at the primary oxidation step before the annealing step and
    (B) the thickness of a field oxide film grown at the secondary oxidation step after the annealing step, ranges from 1:2 to 2:1.

3. The method in accordance with claim 1, wherein:
    the field oxide film formation method is carried out at a temperature of about 900° C. to 1,200° C.

4. The method in accordance with claim 1, wherein:
    the inert gas is nitrogen or argon.

5. The method in accordance with claim 1, wherein:
    the annealing step is carried out at a temperature of about 1,000° C. to 1,200° C.

6. The method in accordance with claim 1, wherein:
    the annealing step is repeatedly carried out n−1 times where the field oxide film formation method comprises n oxidation steps.

7. The method in accordance with claim 1, wherein the field oxide film formation step includes:
    a plurality of successive oxidation steps and
    annealing steps respectively carried out among the successive oxidation steps, wherein the successive oxidation steps and annealing steps are carried out by a single recipe.

8. The method in accordance with claim 1, wherein the field oxide film formation step includes:

a plurality of successive oxidation steps and annealing steps respectively carried out among the successive oxidation steps, wherein the successive oxidation steps and annealing steps are carried out by independent recipes, respectively.

9. A method for forming a field oxide film of a semiconductor device, comprising:

a) providing a semiconductor substrate;

b) sequentially forming a pad oxide film and a first nitride film over the semiconductor substrate;

c) over-etching the first nitride film and the pad oxide film;

d) forming a second nitride film over the entire exposed surface of the resulting structure;

e) selectively removing the second nitride film in such a manner that the second nitride film is left only on respective side surfaces of the first nitride film and the pad oxide film, thereby forming spacers;

f) selectively removing an exposed surface of the semiconductor substrate using the spacers and the first nitride film as a mask, thereby forming a recess in the semiconductor substrate; and g) forming a field oxide film in the recess in the semiconductor substrate, the field oxide film formation step including:

1) a primary oxidation step;

2) an annealing step that is carried out after the primary oxidation step for 0.5 hour to 5 hours in an inert gas atmosphere, to relieve a stress that occurs in the primary oxidation step; and c) a secondary oxidation step that is carried out after the annealing step.

10. The method in accordance with claim 9, wherein the ratio between:

(A) the thickness of a field oxide film grown at the primary oxidation step before the annealing step and (B) the thickness of a field oxide film grown at the secondary oxidation step after the annealing step, ranges from 1:2 to 2:1.

11. The method in accordance with claim 9, wherein:

field oxide film formation step is carried out at a temperature of about 900° C. to 1,200° C.

12. The method in accordance with claim 9, wherein:

the inert gas is nitrogen or argon.

13. The method in accordance with claim 9, wherein:

the annealing step is repeatedly carried out n−1 times where the field oxide film formation step includes n oxidation steps.

14. The method in accordance with claim 1, wherein the field oxide film formation step includes:

a plurality of successive oxidation steps and annealing steps respectively carried out among the successive oxidation steps, wherein the successive oxidation steps and annealing steps are carried out by a single recipe.

15. The method in accordance with claim 9, wherein the field oxide film formation step includes:

a plurality of successive oxidation steps and annealing steps respectively carried out among the successive oxidation steps, wherein the successive oxidation steps and annealing steps are carried out by independent recipes, respectively.

* * * * *